(12) United States Patent
Tang et al.

(10) Patent No.: US 11,315,791 B2
(45) Date of Patent: Apr. 26, 2022

(54) FLUORINE ION IMPLANTATION METHOD AND SYSTEM

(71) Applicant: ENTEGRIS, INC., Billerica, MA (US)

(72) Inventors: Ying Tang, Brookfield, CT (US); Sharad N. Yedave, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 40 days.

(21) Appl. No.: 16/713,381

(22) Filed: Dec. 13, 2019

(65) Prior Publication Data

US 2020/0194264 A1 Jun. 18, 2020

Related U.S. Application Data

(60) Provisional application No. 62/806,365, filed on Feb. 15, 2019, provisional application No. 62/780,219, filed on Dec. 15, 2018, provisional application No. 62/780,222, filed on Dec. 15, 2018.

(51) Int. Cl.
*H01L 21/265* (2006.01)
*H01J 37/317* (2006.01)
*H01J 37/32* (2006.01)

(52) U.S. Cl.
CPC .... *H01L 21/26513* (2013.01); *H01J 37/3171* (2013.01); *H01J 37/32055* (2013.01); *H01J 37/32449* (2013.01); *H01J 37/32467* (2013.01); *H01L 21/265* (2013.01); *H01J 2237/3365* (2013.01)

(58) Field of Classification Search
CPC .............................................. H01L 21/26513
USPC ..................................................... 250/492.3
See application file for complete search history.

(56) References Cited

U.S. PATENT DOCUMENTS

| | | | |
|---|---|---|---|
| 7,518,124 B2 | 4/2009 | Goldberg | |
| 7,932,539 B2 | 4/2011 | Chen | |
| 7,943,204 B2 | 5/2011 | Olander | |
| 8,692,216 B2 * | 4/2014 | Kariya | H01J 37/304 250/492.21 |
| 10,920,087 B2 * | 2/2021 | Bishop | C01B 35/061 |
| 2010/0084687 A1 | 4/2010 | Chen | |
| 2011/0259366 A1 | 10/2011 | Sweeney | |
| 2014/0061501 A1 | 3/2014 | Sinha | |
| 2014/0342538 A1 | 11/2014 | Jones | |
| 2015/0179393 A1 | 6/2015 | Colvin | |
| 2015/0248992 A1 | 9/2015 | Sinha | |
| 2016/0211137 A1 | 7/2016 | Tang | |
| 2017/0330756 A1 | 11/2017 | Kaim | |

FOREIGN PATENT DOCUMENTS

| | | |
|---|---|---|
| TW | 201802894 A | 1/2018 |
| WO | 2008128039 A2 | 10/2008 |
| WO | 2011056515 A2 | 5/2011 |

* cited by examiner

*Primary Examiner* — Phillip A Johnston
(74) *Attorney, Agent, or Firm* — Entegris, Inc.

(57) ABSTRACT

A method and system for fluorine ion implantation is described, where a fluorine compound capable of forming multiple fluorine ionic species is introduced into an ion implanter at a predetermined flow rate. Fluorine ionic species are generated at a predetermined arc power and source magnetic field, providing an optimized beam current for the desired fluorine ionic specie. The desired fluorine ionic specie, such as one having multiple fluorine atoms, is implanted into the substrate under the selected operating conditions.

16 Claims, 13 Drawing Sheets

FLUORINE ION IMPLANTATION METHOD AND SYSTEM

FIELD

The present disclosure relates to fluorine ion implantation methods and systems.

BACKGROUND

Fluorine implantation is used in advanced semiconductor device manufacturing for defect engineering, shallow junction formation, and material modification. A common setup for fluorine implantation includes feeding a fluoride dopant source gas into the ion source to provide fluorine (F) as one of the dissociation byproducts.

However, conventional fluorine implant processes are generally limited with regards to the type of fluorine ion implanted and the specificity of fluorine ion implantation, such as with regards to fluorine ion implantation depth. Further, ionic species generated upon decomposition of the fluorine-containing compound may also be undesirably co-implanted with the fluorine.

Also, use of fluorine containing feed gases creates a halogen cycle which can negatively impact ion source performance, source life, implant tool productivity and cost of tool ownership. Various challenges in art remain for improving fluorine ion beam performance considering its broad potential applications.

SUMMARY

The present disclosure relates to methods and systems for implanting one or more desired fluorine ionic species into a substrate in an ion implantation process. The methods and systems allow for a plurality of fluorine ionic species to be generated from a fluorine-containing compound. Using predetermined flow rate, arc power, and source magnetic field conditions, an optimized beam current can be generated for a desired fluorine ion species, which in turn can be targeted for implantation into a substrate. Accordingly, the current method allows greater control over the implanted fluorine species and how they are implanted into the substrate, which in turn provides substrates with higher levels of chemical modifications, such as microelectronic devices having improved electronic properties.

According to one embodiment, a fluorine ion implantation method includes a steps of flowing a composition comprising a fluorine compound comprising a non-fluorine atom and one or more fluorine atom(s) to an ion implanter at a predetermined flow rate, the ion implanted configured for fluorine ion implantation into a substrate. The method also includes operating the ion implanter to generate fluorine ionic species from the fluorine compound at a predetermined arc power and source magnet field wherein the fluorine ionic species comprise a desired fluorine ionic specie for substrate implantation. During operation the flow rate, arc power, and source magnet field are chosen to provide an optimized beam current for the desired fluorine ionic specie. Accordingly, the desired fluorine ionic species is implanted into the substrate under the selected operating conditions.

In some embodiments, the method can be beneficial for implanting $F^+$ ion species. The ion implantation system is operated at a predetermined flow rate, arc power, and source magnet field to provide an optimized beam current of the fluorine ionic species $F^+$. The fluorine ionic species $F^+$ is implanted into the substrate under the selected operating conditions. In some example, the fluorine ionic species $F^+$ can be achieved using a fluorine containing compound such as $SiF_4$, $BF_3$, $GeF_4$, and $CF_4$, but not limited to these. In some cases, higher beam currents are observed when the fluorine ionic species $F^+$ is generated from $CF_4$ under certain conditions when compared to the fluorine ionic species $F^+$ generated from $SiF_4$, $BF_3$, or $GeF_4$ under the same or similar conditions. Higher beam currents appear to be obtainable at a lower gas flow rates. Also, the addition of a hydrogen ($H_2$) co-gas to the $CF_4$ gas stream does not appear to significantly impact beam current for a mixture or co-flow gas stream containing up to 33% hydrogen gas.

Other embodiments relate to methods for implanting ion species having multiple fluorine atoms, referred to herein as "molecular implantation" or "cluster implantation," achieved by obtaining an optimal beam current for such ionic species. Cluster implantation can be achieved from fluorinated compounds including atoms such as boron, silicon, germanium, antimony, arsenic, xenon, molybdenum, carbon, selenium, sulfur, and nitrogen. An exemplary fluorine compound is $SiF_4$ generating fluorine ionic species including $F^+$, $SiF^+$, $SiF_2^+$, $SiF_3^+$, and $SiF_4^+$. Another exemplary fluorine compound is $BF_3$ generating fluorine ionic species including $F^+$, $BF^+$, $BF_2^+$, and $BF_3^+$. An exemplary fluorine compound is $GeF_4$, generating fluorine ionic species including $F^+$, $GeF^+$, $GeF_2^+$, $GeF_3^+$, and $GeF_4^+$. Yet another exemplary fluorine containing compound is $CF_4$ generating fluorine ionic species including $F^+$, $F_2^+$, $CF^+$, $CF_2^+$, $CF_3^+$, and $CF_4^+$.

For cluster implantation a higher beam current can be achieved using methods of the disclosure. Further, fluorine ionic species that are different than the $F^+$ ion (molecular or cluster ions) can be more easily ionized, allowing for reduction in arc power and stress to the ion source and implant tool. Also, a desired implanting depth can be achieved at higher energy, which can easily be achieved and less stressful for the implant tool. Molecular or cluster implantation, which can be performed at a lower beam current using methods of the disclosure, can also prolong source life. Further, the method of the disclosure can optionally be used to implant atoms or chemistries that are different than the fluorine, thereby allowing an overall reduction in the number of implantation steps.

Embodiments of the invention also include flowing a hydrogen-containing gas which is different than the fluorine compound, to the ion implanter. Embodiments of the invention also include flowing an oxygen-containing gas which is different than the fluorine compound, to the ion implanter. Even further, embodiments of the invention can also include flowing an inert gas to the ion implanter. Methods of the disclosure include flowing one or more of these gases along with fluorine compound independently or in mixture with one another. In some embodiments, hydrogen gas ($H_2$) can be flowed with a fluorine containing gas either independently (co-flow) or in-mixture. Use of one or more of these gases that are different than the fluorine compound can improve implant beam current, source life performance, or both.

DETAILED DESCRIPTION

Figure 1:
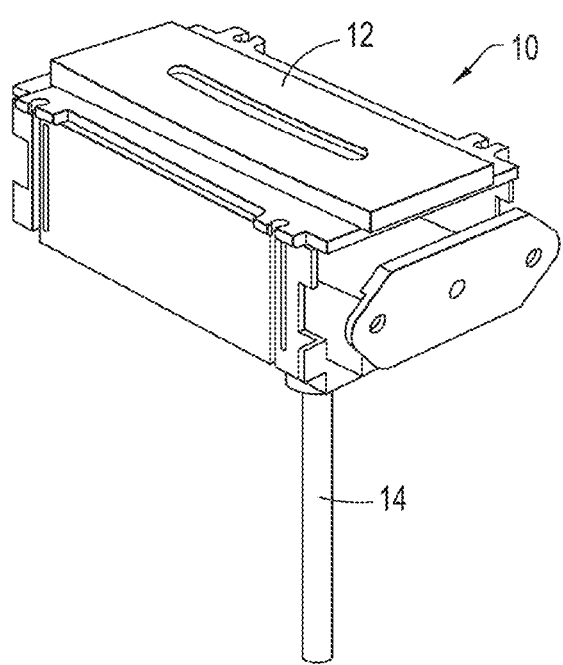
FIG. 1 is a schematic representation of an ion implantation system, including an arc chamber with a gas feed line for feeding dopant source gas to the arc chamber for ionization thereof in the chamber.

The present disclosure relates to fluorine ion implantation, and in various aspects to methods and systems in which a fluorine compound is used that generates a plurality of fluorine ionic species, and the system is operated at a predetermined flow rate of the fluorine compound, a predetermined arc power, and predetermined source magnetic field. The operating conditions provide an optimized beam current for a desired fluorine ion species, which in turn can be targeted for implantation into a substrate. In some cases, the desired fluorine ionic species can be monatomic $F^+$. In other cases, the desired fluorine species can contain polyatomic or molecular or cluster fluorine ionic species such as, for example, $F_2^+$ or SiF3+ for "cluster implantation."

In methods of the disclosure one or more fluorine compound(s) that is able to be ionized into fluorine-containing ionic species is used.

One type of fluorine compound is represented by compounds having the formula $Q_xF_y$. In $Q_xF_y$, Q is an element capable of forming a bond with fluorine (F), and both x and y are integers that are 1 or greater. In embodiments, x is an integer in the range of 1 to 3, and y is an integer in the range of 1 to 8; in embodiments, x is 1 or 2, and y is an integer in the range of 1 to 6. For some compounds of formula $Q_xF_y$, y is equal to x, for example both y and x are 1. For some compounds of formula $Q_xF_y$, y is greater than x. For example, y is two times x, y is three times x, y is four times x, y is five times x, or y is six times x. For some compounds of formula $Q_xF_y$, y is 1+x, y is 2+x, y is 3+x, y is 4+x, or y is 5+x.

Upon ionization, such as using conditions described herein, compounds having the formula $Q_xF_y$ can generate fluorine ionic species including compounds of formula $F^+$, $Q_uF_v^+$, and $F_2^+$. Species having multiple fluorine atoms are referred to as molecular or cluster species. Both u and v are integers, and can be described in relation to x and y of formula $Q_xF_y$, wherein x is an integer that is greater than or equal to u, and u is an integer that is greater than or equal to 1; and wherein y is an integer that is greater than or equal to v, and v is an integer that is greater than or equal to 1. Accordingly, for ionic species of formula $Q_uF_v^+$, and both u and v are integers that are 1 or greater. In embodiments, u is an integer in the range of 1 to 3, and v is an integer in the range of 1 to 8; in embodiments, u is 1 or 2, and v is an integer in the range of 1 to 6. For some ionic species of formula $Q_uF_v^+$, u is equal to v, for example both u and v are 1. For some ionic species of formula $Q_uF_v^+$, v is greater than u. For example, v is two times u, v is three times u, v is four times u, v is five times u, or v is six times u. For some ionic species of formula $Q_uF_v^+$, v is 1+u, v is 2+u, v is 3+u, v is 4+u, or v is 5+u.

Examples of silicon- and fluorine-containing compounds include those having the formulas $SiF_4$ and $Si_2F_6$, which can be ionized to generate fluorine ionic species, including ionic species selected from the group consisting of $F^+$, $F_2^+$, $SiF^+$, $SiF_2^+$, $SiF_3^+$, $SiF_4^+$, $Si_2F^+$, $Si_2F_2^+$, $Si_2F_3^+$, $Si_2F_4^+$, $Si_2F_5^+$ and $Si_2F_6^+$. In a preferred aspect $SiF_4$ is ionized to generate two or more species selected from the group consisting of $F^+$, $SiF^{30}$, $SiF_2^+$, $SiF_3^+$, and $SiF_4^+$.

Examples of boron- and fluorine-containing compounds include those of formulas $BF_3$ and $B_2F_4$, which can be ionized to generate fluorine ionic species, including ionic species selected from the group consisting of $F^+$, $F_2^+$, $BF^+$, $BF_2^+$, $BF_3^+$, $B_2F^+$, $B_2F_2^+$, $B_2F_3^+$ and $B_2F_4^+$. In a preferred aspect $BF_3$ is ionized to generate two or more species selected from the group consisting of $F^+$, $BF^+$, $BF_2^+$, and $BF_3^+$.

Examples of germanium- and fluorine-containing compounds include those of formulas $GeF_4$ and $Ge_2F_6$, which can be ionized to generate fluorine ionic species, including ionic species selected from the group consisting of $F^+$, $F_2^+$, $GeF^+$, $GeF_2^+$, $GeF_3^+$, $GeF_4^+$, $Ge_2F^+$, $Ge_2F_2^+$, $Ge_2F_3^+$, $Ge_2F_4^+$, $Ge_2F_5^+$ and $Ge_2F_6^+$. In a preferred aspect $GeF_4$ is ionized to generate two or more species selected from the group consisting of $F^+$, $GeF^+$, $GeF_2^+$, $GeF_3^+$, and $GeF_4^+$.

Examples of phosphorus- and fluorine-containing compounds include those of formulas $PF_3$ and $PF_5$, which can be ionized to generate fluorine ionic species, including ionic species selected from the group consisting of $F^+$, $F_2^+$, and $PF^+$, $PF_2^+$, $PF_3^+$, $PF_4^+$, and $PF_5^+$.

Examples of arsenic- and fluorine-containing compounds include those of formulas $AsF_3$ and $AsF_5$, can be ionized to generate fluorine ionic species, including ionic species selected from the group consisting of $F^+$, $F_2^+$, and $AsF^+$, $AsF_2^+$, $AsF_3^+$, $AsF_4^+$, and $AsF_5^+$.

An example of an antimony- and fluorine-containing compound includes that of formula $SbF_5$, which can be ionized to generate fluorine ionic species, including ionic species selected from the group consisting of $F^+$, $F_2^+$, and $SbF^+$, $SbF_2^+$, $SbF_3^+$, $SbF_4^+$, and $SbF_5^+$.

Examples of tungsten- and fluorine-containing compounds include those of formulas is $WF_6$, which can be ionized to generate fluorine ionic species, including ionic species selected from the group consisting of $F^+$, $F_2^+$, and $WF^+$, $WF_2^+$, $WF_3^+$, $WF_4^+$, $WF_5^+$, and $WF_6^+$.

Examples of nitrogen- and fluorine-containing compounds include those of formulas $NF_3$ and $N_2F_4$, and the fluorine ionic species include two or more species selected from the group consisting of $F^+$, $F_2^+$, $NF^+$, $NF_2^+$, $NF_3^+$, $N_2F^+$, $N_2F_2^+$, $N_2F_3^+$, $N_2F_4^+$, $N_2F_5^+$ and $N_2F_6^+$.

Examples of carbon- and fluorine-containing compounds include those of formulas $CF_4$ and $C_2F_6$, and the fluorine ionic species include two or more species selected from the group consisting of $F^+$, $F_2^+$, $CF^+$, $CF_2^+$, $CF_3^+$, $CF_4^+$, $C_2F^+$, $C_2F_2^+$, $C_2F_3^+$, $C_2F_4^+$, $C_2F_5^+$ and $C_2F_6^+$.

Other types of fluorine-containing compounds that can generate fluorine ionic species include compounds of formula $Q_xR_zF_y$, wherein Q and R are elements capable of forming a bond with fluorine (F), and x, z, and y are integer of 1 or greater. In embodiments Q is selected from the group consisting of B, Si, Ge, P, As, C, and N; and R is selected from H and O. In embodiments, x is an integer in the range of 1 to 3, and is preferably 1 or 2; z is an integer in the range of 1 to 4, and is preferably 1, 2, or 3; and y is an integer in the range of 1 to 8, preferably 1 to 6.

Upon ionization, such as using conditions described herein, compounds having the formula $Q_xR_zF_y$ can generate fluorine ionic species including those of formula $Q_uR_wF_v^+$, and $F^+$, $F_2^+$. All of u, w, and v are integers, and can be described in relation to x, z, and y of formula $Q_xR_zF_y$, wherein x is an integer that is greater than or equal to u, and u is an integer that is greater than or equal to 1; wherein y is an integer that is greater than or equal to v, and v is an integer that is greater than or equal to 1, and wherein z is an integer that is greater than or equal to w, and w is an integer that is greater than or equal to 1. Accordingly, for ionic species of formula $Q_uR_w$, $F_v^+$, all of u, w, and v are integers are 1 or greater. Preferably u is an integer in the range of 1 to 3, and is preferably 1 or 2; w is an integer in the range of 1 to 4, and is preferably 1, 2, or 3; and v is an integer in the range of 1 to 8, preferably 1 to 6.

Examples of compounds having the formula $Q_xR_zF_y$ include, but are not limited to those such as BHF, $BHF_2$, $SiHF_3$, $SiH_3F_2$, $SiH_3F$, $Si_2H_3F_3$, $Si_2H_5F$, $Si_2HF_5$, $GeHF_3$, $GeH_2F_2$, $GeH_3F$, $PHF_2$, $PH_2F$, $PH_3F_2$, $P_2HF$, $AsHF_2$, $AsH_2F$, $AsH_3F_2$, $C_nH_xF_{2n+2-x}$, $C_nH_xF_{2n-x}$, $C_nH_xF_{2n-2-x}$, $COF_2$, $NHF_2$, $NH_2F$, NHF, and $N_2H_3F$, wherein n is an integer in the range of 1–3, and x is 0, 1, or 2.

Other types of fluorine-containing compounds that can generate fluorine ionic species include compounds of formula $F_y$, and the fluorine ionic species includes a compound of formula $F_v^+$, wherein y is an integer that is greater than or equal to v, and v is an integer that is greater than or equal to 1.

Methods of the disclosure can also include use of a mixture of two or more fluorine compounds of formulas $Q_xF_y$, $Q_xR_zF_y$, and $F_y$. If two or more different fluorine-containing compounds are used, these may be flowed into the implantation chamber independently, or can be flowed as a mixture into the chamber.

In methods of the disclosure, the one or more fluorine-containing compounds are flowed into the implantation chamber to generate fluorine ionic species. The fluorine ionic species can include a species with the greatest number of fluorine atoms. In methods of the disclosure the flow rate, arc power and source magnet field are chosen so the species with the desired number of fluorine atoms are optimized for the maximum beam current. In other methods, the flow rate, arc power, and source magnetic field are selected so that the fluorine ionic specie $F^+$ is optimized for the maximum beam current.

Operation of the system for fluorine ion implantation can be described in terms of arc power and arc voltage. In some modes of practice, the system is operated to provide an arc power is in the range of about 5 W to about 2500 W, or in some modes of practice an arc power is in the range of about 90 W to about 1500 W. In order to achieve an arc power in one of these ranges, the system can be operated so arc power is generated at an arc voltage in the range of about 30 V to about 150 V, or more specifically is in the range of about 60 V to about 125 V.

Operation of the system for fluorine ion implantation can also be described in terms of the flow rate of the fluorine-containing compound into the ion implantation chamber. In some embodiments, fluorine-containing compound is flowed into the chamber at a rate not greater than 10 sccm, and in embodiments, the fluorine-containing compound is flowed at a rate in the range of 0.1 sccm to 6 sccm. In still other embodiments, the fluorine-containing compound is flowed to the system at a range of 0.2 sccm to 4 sccm and more particularly at a range of 0.2 sccm to 2 sccm.

In some specific modes of practice the fluorine compound is $BF_3$, and the fluorine ionic species include two or more species selected from the group consisting of $F^+$, F2+, $BF^+$, $BF_2^+$, and $BF_3^+$; the arc power is in the range of 50 W to 2500 W which is generated at an arc voltage in the range of 30 V to 150 V, and the flow rate is in the range of 1.25 sccm to 1.75 sccm.

In some specific modes of practice the fluorine compound is $SiF_4$, and the fluorine ionic species include two or more species selected from the group consisting of $F^+$, F2+, $SiF^+$, $SiF_2^+$, $SiF_3^+$, and $SiF_4^+$; the arc power is in the range of 50 W to 2500 W which is generated at an arc voltage in the range of 75 V to 125 V, and the flow rate is in the range of 1.0 sccm to 1.5 sccm.

In some specific modes of practice the fluorine compound is $GeF_4$, and the fluorine ionic species include two or more species selected from the group consisting of $F^+$, F2+, $GeF_2^+$, $GeF_2^+$, $GeF_3^+$, and $GeF_4^+$; the arc power is in the range of 50 W to 2500 W which is generated at an arc voltage in the range of 30 V to 150 V, and the flow rate is in the range of 0.2 sccm to 0.8 sccm.

In some specific modes of practice, the fluorine compound is $CF_4$ and the fluorine ionic species includes at least one of F+, $F_2^+$, $CF^+$, $CF_2^+$, and $CF_3^+$; the arc power is in the range of the arc power is in the range of 50 W to 2500 W generated with arc voltage in the range of 30 V to 150 V, and the flow rate is in the range of 0.2 sccm to 1.5 sccm and more particularly in the range of 0.3 sccm to 1.0 sccm.

Optionally, methods of the disclosure can include flowing a (non-fluorinated) hydrogen- or hydride-containing compound which is different than the fluorine compound, to the ion implanter. Examples of such compounds include, but are not limited to, compound compounds such as $H_2$, $B_2H_6$, $SiH_4$, $Si_2H_6$, $GeH_4$, $Ge_2H_6$, PH3, $AsH_3$ $CH_4$, $C_2H_6$, $C_xH_y$, (where x and y are equal or more than 1), NH3 and $N2H_4$. In exemplary modes of practice, the hydrogen- or hydride-containing compound is flowed into the arc chamber at a rate from 0.05 sccm to 10 sccm.

Optionally, methods of the disclosure can include flowing a (non-fluorinated) oxygen-containing compound which is different than the fluorine compound, to the ion implanter.

Examples of such compounds include, but are not limited to, compound compounds such as $O_2$, $O_3$, $H_2O$, $H_2O_2$, CO, $CO_2$, NO, $NO_2$, N2O, $N_4O$, $N_2O_3$, $N_2O_4$, $N_2O_5$ and $N_2O_6$.

Optionally, methods of the disclosure can include flowing an inert gas to the ion implanter. Examples of inert gases include nitrogen, helium, neon, argon, krypton, and xenon.

In modes of practice one of hydrogen- or hydride-containing gas, oxygen-containing gas, or inert gas is flowed to the implanter along with the fluorine-containing compound; in other modes of practice two of the gases are flowed; and in yet other modes of practice all three gases are flowed to the implanted along with the fluorine-containing compound.

If more than one gas is flowed to the chamber the gases can be flowed individually. Alternatively, the gases can be flowed in mixture. For example, any two or more of the fluorine-containing, hydrogen-containing, oxygen-containing and/or inert gases can be pre-mixture in gas cylinder package. In yet other embodiments, two or more gases are in mixture and then another gas is individually flowed to the chamber. In one embodiment, hydrogen gas is co-flowed or pre-mixed with the fluorine containing gas.

Methods of the disclosure can be performed using an ion source apparatus for ion implantation. Any type of ion implantation system can be used for the fluorine implantation methods as described herein. The system includes an arc chamber formed from one or more tungsten or non-tungsten containing materials. In some embodiments, the combination of utilizing a carbon- and fluorine-containing compound such as, for example, $CF_4$ or $C_2F_6$ with a tungsten arc chamber and/or or tungsten containing liner for fluorine ion implantation may improve the F+ implant performance, including beam current and source life, and may reduce the amount of tungsten fluoride formed during an implantation process.

Exemplary non-tungsten containing materials can include, but are not limited to a graphite-containing material, a carbide-containing material, a fluoride-containing material, a nitride-containing material, an oxide-containing material, or a ceramic. Exemplary systems using non-tungsten containing materials are described in U.S. Provisional Application No. 62/780,222 which is incorporated herein by reference in its entirety for all purposes. The presence of these non-tungsten materials in the chamber can replace tungsten, which, in some embodiments, can improve the F+ implant performance, including beam current and source life. In particular, these materials can reduce the amount of tungsten fluoride formed during an implantation process.

The ion source apparatus can include a structural member disposed in the ion source chamber, such as a liner or other structural components of the ion source chamber. A liner may be a flat, e.g., planar piece of structure having two opposed major surfaces and a thickness therebetween. A liner may be rectangular, curved (e.g., rounded), angular, or otherwise shaped. A liner can be removable, meaning that the liner can be inserted and removed from the interior space of the ion source chamber. In other cases a liner can be permanent and non-removable from the chamber.

Referring now to the drawings, FIG. 1 is a schematic representation of an ion implantation system 10, including an arc chamber 12 with a gas feed line 14 for feeding the fluorine-containing gas to the arc chamber for ionization thereof in the chamber. The arc chamber 12 thus provides an ion source chamber. In some embodiments, the arc chamber can include a tungsten arc chamber and a tungsten liner. In other embodiments, the arc chamber can include a tungsten arc chamber and a non-tungsten material containing liner. In still other embodiments, the arc chamber and the liner can both include a non-tungsten containing material. Suitable non-tungsten containing materials can include, but are not limited to a graphite-containing material, a carbide-containing material, a fluoride-containing material, a nitride-containing material, an oxide-containing material, or a ceramic to reduce the amount of tungsten fluoride formation during an implantation process and/or improve the fluorine implant beam current.

Figure 2:
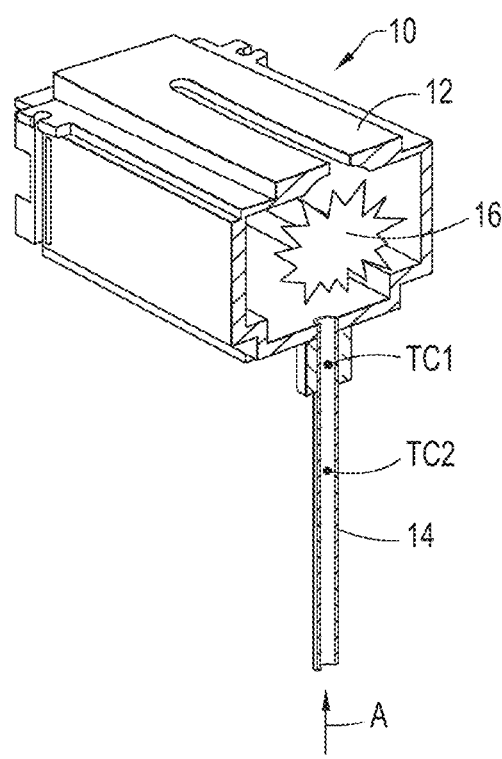
FIG. 2 is a cross section of the FIG. 1 ion implantation system schematically showing the generation of a plasma in the arc chamber of such system.

FIG. 2 is a cross section of the FIG. 1 ion implantation system 10 schematically showing the generation of a plasma 16 in the arc chamber 12 of such system. The fluorine-containing gas is flowed in the direction indicated by arrow A into the fluorine-containing gas feed line 14, having monitoring thermocouples TC1 and TC2 secured thereto in monitoring relationship to determine the quality of the thermal state of the feed line and gas entering the arc chamber, as may be desirable in connection with the use of a thermal management system for the ion implantation system.

Figure 3:
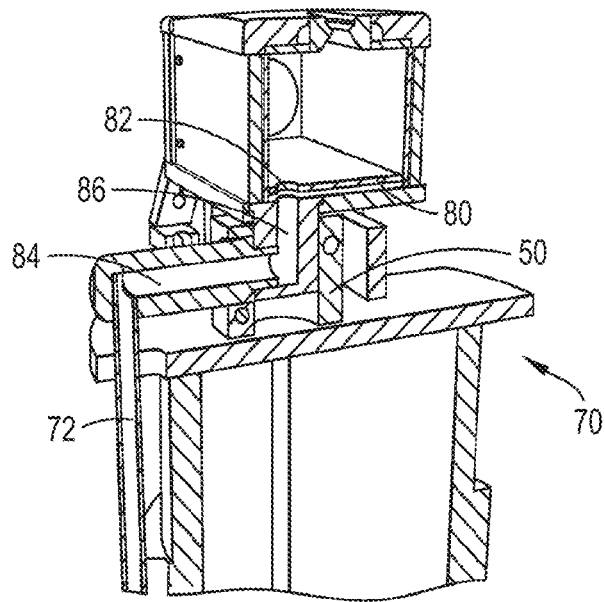
FIG. 3 is a perspective view, in cross-section, of an ion source assembly comprising an ion source apparatus and heat sink apparatus for thermal management of the ion source apparatus.

FIG. 3 is a perspective view, in cross-section, of the ion source assembly comprising the ion source apparatus 70 and an optional heat sink apparatus 50 for thermal management of the system. This cross-sectional view shows the fluorine-containing gas feed line 72 connecting to gas flow passage 84 in the gas feed plug and to the gas flow passage 86 in the gas bushing associated with the ion source.

The ion source apparatus shown in FIG. 3 includes a base 80. The base 80 can be coated or modified with a tungsten containing material or can be coated or modified with a graphite-containing material, a carbide-containing material, a fluoride-containing material, a nitride-containing material, an oxide-containing material, or a ceramic. The base 80 can include an opening 82 therein.

Figure 4:
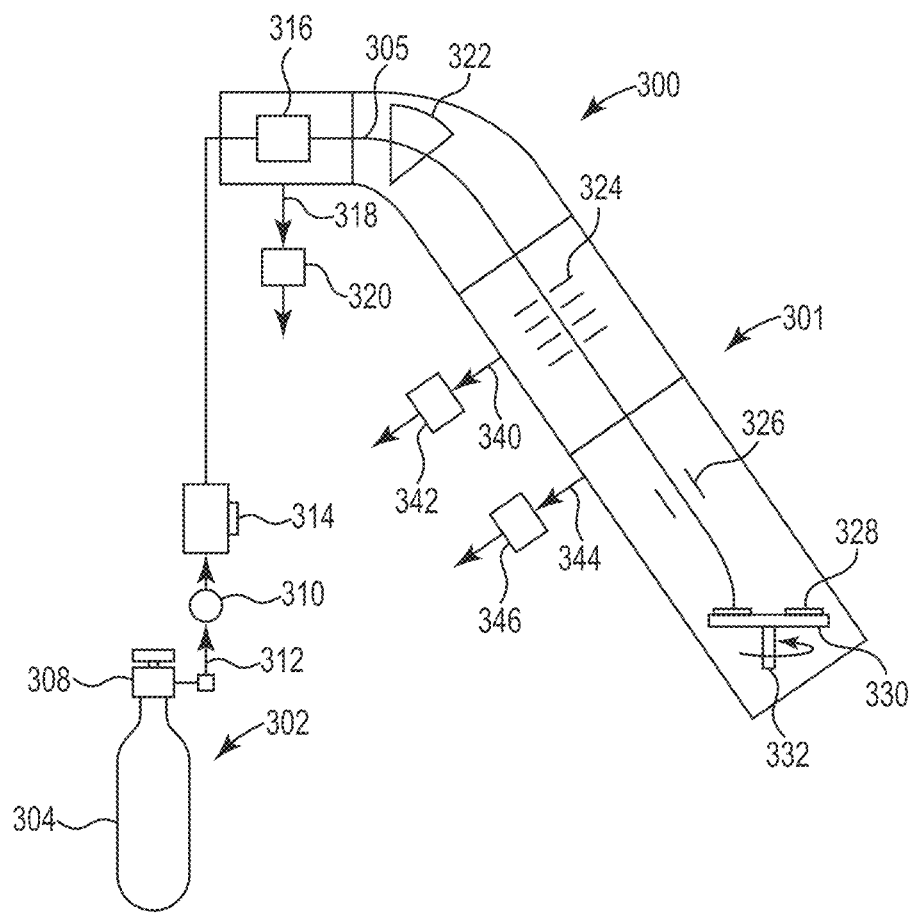
FIG. 4 is a schematic representation of an ion implant process system including a storage and dispensing vessel containing gas which is supplied for ion implantation doping of a substrate in the illustrated ion implant chamber.

FIG. 4 is a schematic representation of an ion implant process system 300 including a storage and dispensing vessel 302 holding a reactant gas which is supplied for in situ reaction with a fluorine-containing gas in the ion source chamber to generate fluorine ionic species for ion implantation of a substrate 328 in the illustrated ion implant chamber 301.

The storage and dispensing vessel 302 comprises a vessel wall 306 enclosing an interior volume holding the fluorine gas.

The vessel may be a gas cylinder of conventional type, with an interior volume arranged to hold only gas, or alternatively, the vessel may contain a sorbent material having sorptive affinity for the reactant gas, and from which the co-reactant source gas is desorbable for discharge from the vessel under dispensing conditions.

The storage and dispensing vessel 302 includes a valve head 308 coupled in gas flow communication with a discharge line 312. A pressure sensor 310 is disposed in the line 312, together with a mass flow controller 314. Other monitoring and sensing components may be coupled with the line, and interfaced with control means such as actuators, feedback and computer control systems, cycle timers, etc.

The ion implant chamber 301 contains an ionizer 316 receiving the dispensed fluorine-containing gas from line 312 that is reactive with the dopant source reactant provided in or in association with the ionizer chamber to generate fluorine ionic species that under the ionization conditions in the ionizer chamber produce an ion beam 305. The ion beam 305 passes through the mass analyzer unit 322 which selects the ions needed and rejects the non-selected ions.

The selected ions pass through the acceleration electrode array 324 and then the deflection electrodes 326. The resultingly focused ion beam is impinged on the substrate element 328 disposed on the rotatable holder 330 mounted in turn on spindle 332, to form a doped (fluorine-doped) substrate as the ion implantation product.

The respective sections of the ion implant chamber 301 are exhausted through lines 318, 340 and 344 by means of pumps 320, 342 and 346, respectively.

Example 1

Figure 5:
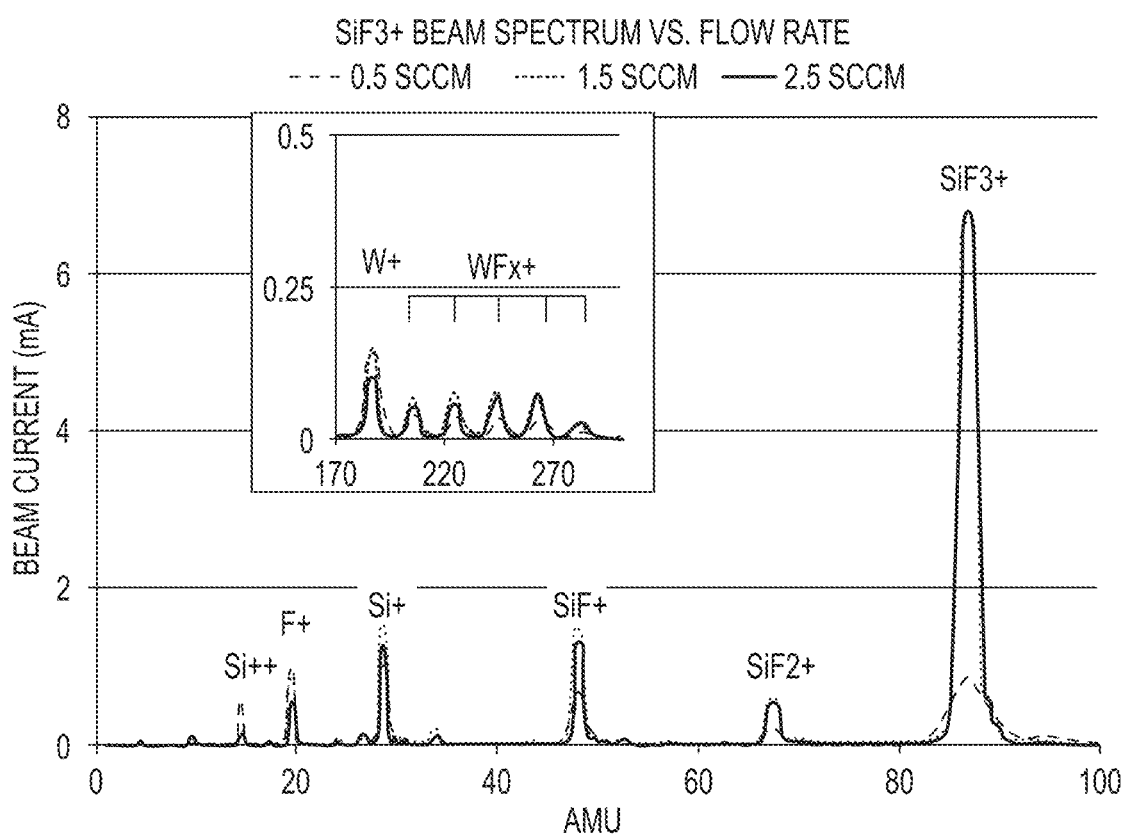
FIG. 5 shows beam spectrum data using a $SiF_4$ at different flow rates in the presence of a tungsten arc chamber having tungsten liners.

According to the invention, a fluorine-containing gas, $SiF_4$, was flowed into an ionization chamber at various flow rates (0.5, 1.5, and 2.5 sccm) at a predetermined arc power and magnetic field. Beam current was measured for ionic species at the various flow rates. High $SiF_3^+$ beam current was achieved with optimization of conditions and beam tuning to $SiF_3^+$ species as shown in FIG. 5.

Example 2

Figure 6:
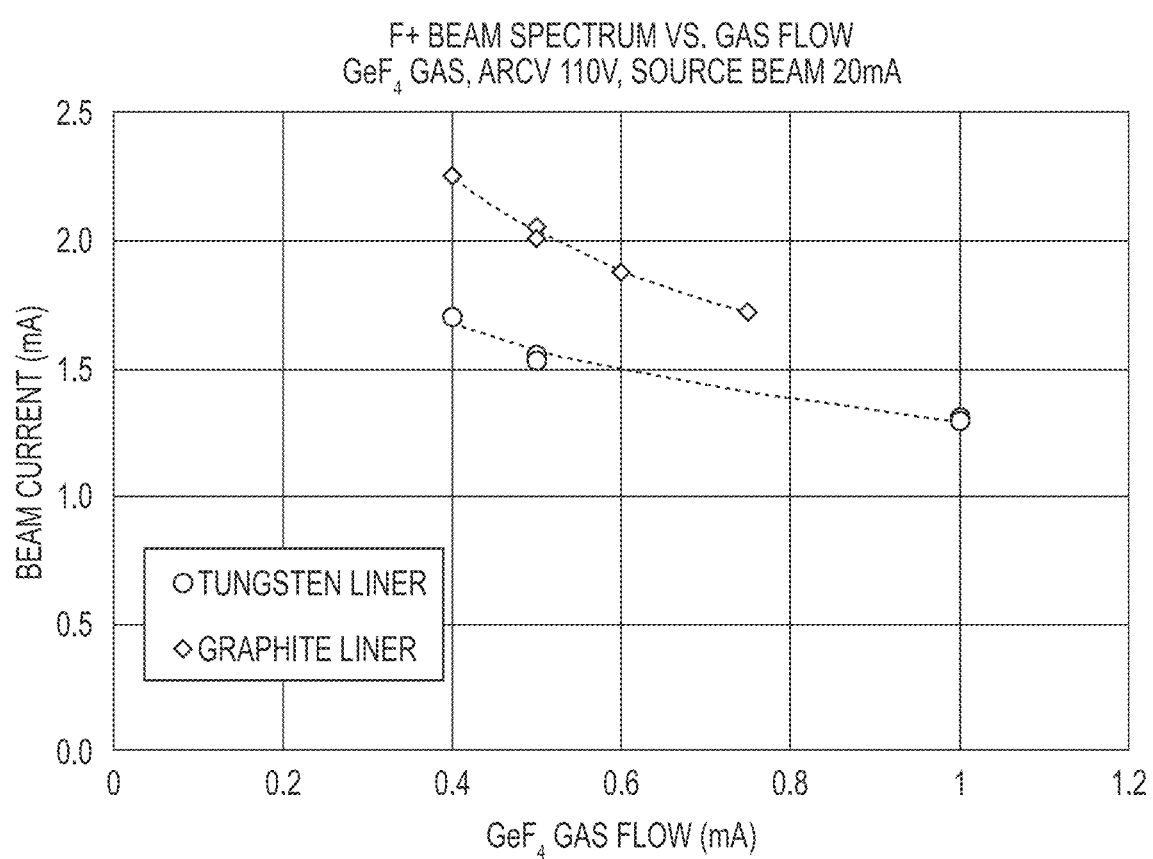
FIG. 6 shows $F^+$ beam current data from experiments using a $GeF_4$ gas in the presence of a tungsten liner versus a graphite liner.

A fluorine-containing gas, $GeF_4$, was flowed into an ionization chamber having tungsten liners and an ionization chamber having graphite liners. The system was operated at an arc voltage of 110V and source beam of 20 mA. F+ ion beam current was measured at various gas $GeF_4$ flow rates. At each flow rate tested, the system with the graphite liner provided a higher $F^+$ beam current as compared to the system with the tungsten liner. Results are shown in FIG. 6.

Example 3

Figure 7:
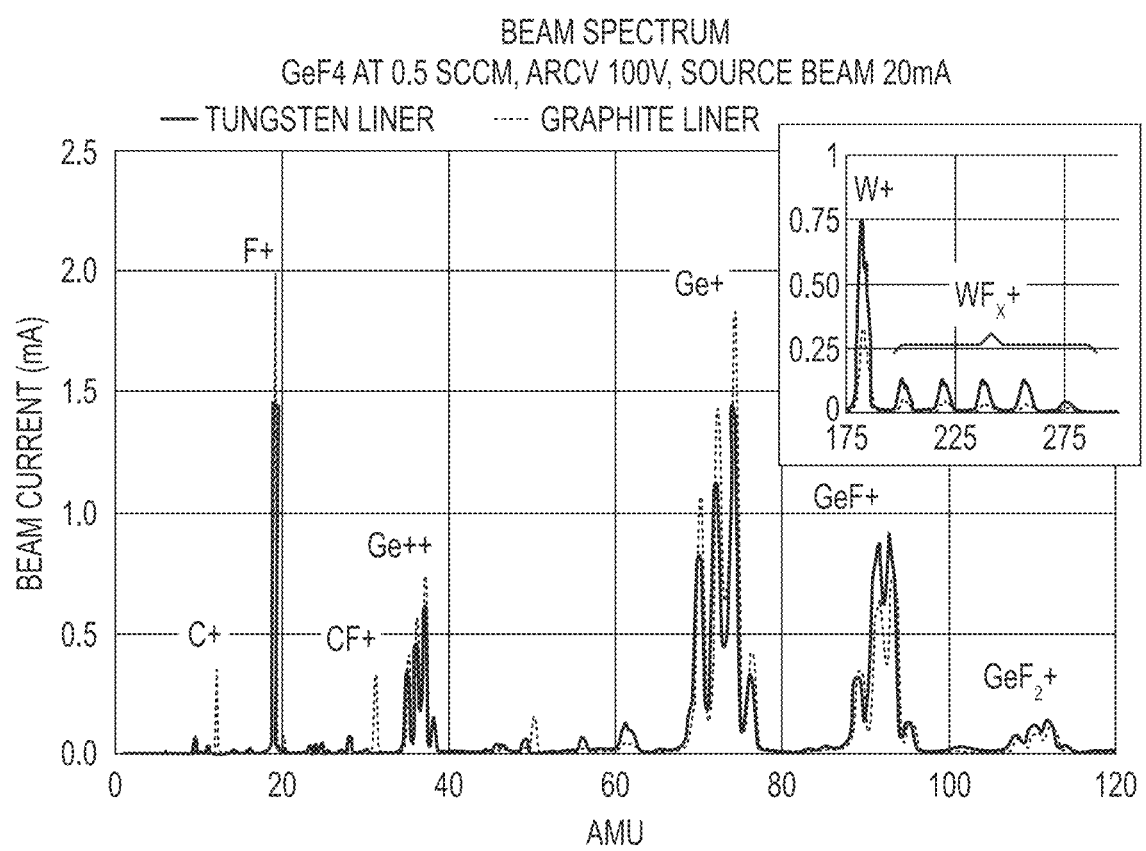
FIG. 7 shows ionized species from experiments using $GeF_4$ gas and lower $W^+$ and $WF_x^+$ beams when the graphite liners were used.

The beam spectrums of various ionized species resulting from the processes described in Example 2 were determined. Results show that from the $GeF_4$ beam spectrum, significantly lower $W^+$ and $WF_x^+$ beams with graphite liners. See FIG. 7

Example 4

Figure 8:
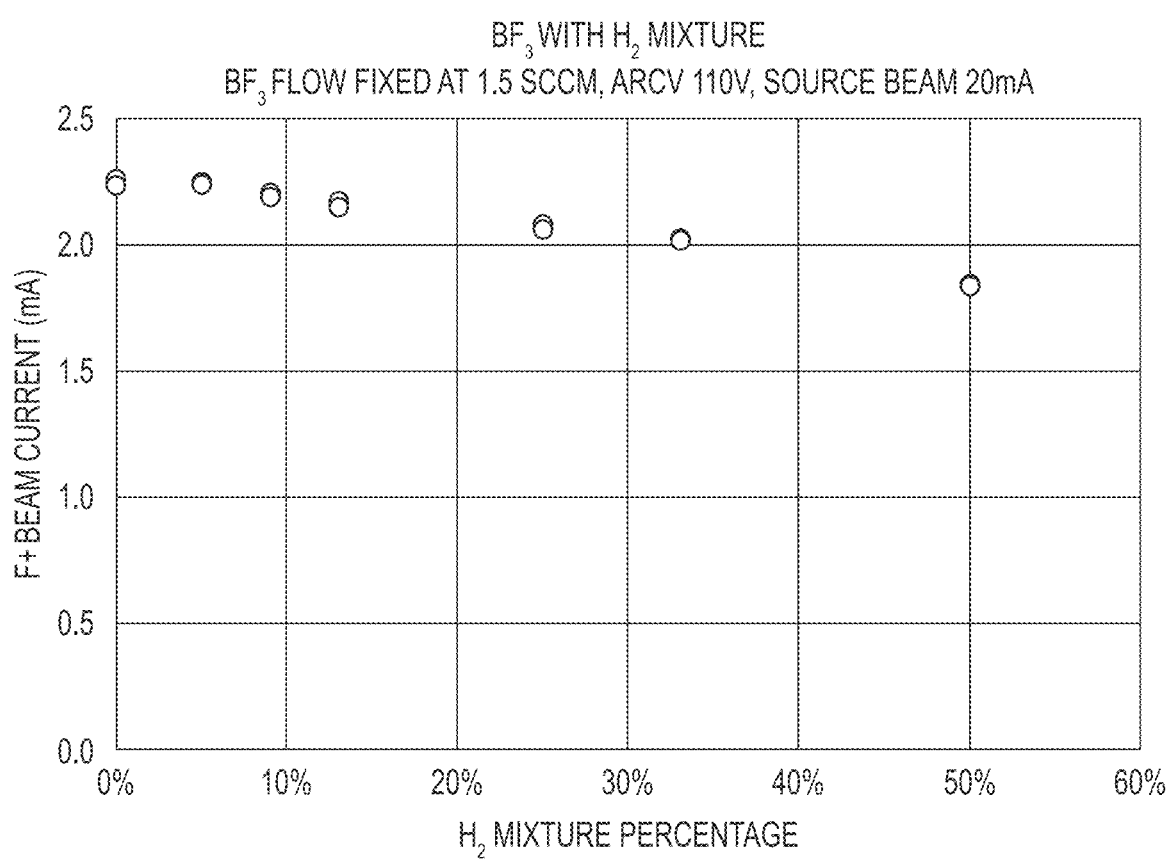
FIG. 8 shows $F^+$ beam current data from experiments using mixtures of $BF_3$ and $H_2$ gases.
Figure 9:
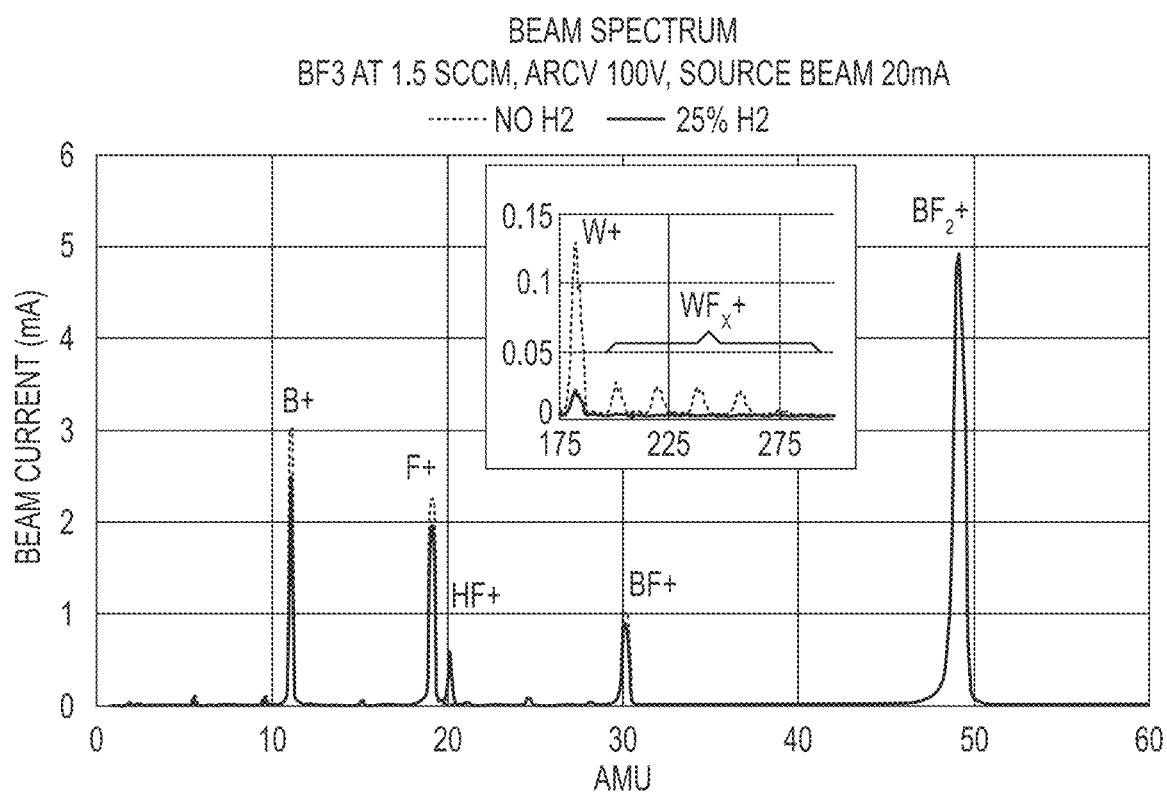
FIG. 9 shows ionized species from experiments using $BF_3/H_2$ mixture and lowering $W^+$ and $WF_x^+$ beams when $H_2$ was mixed with the $BF_3$ gas.

A fluorine-containing gas, $BF_3$, was flowed into an ionization chamber alone and with the presence of hydrogen gas ($H_2$). The flow rate of $BF_3$, was at 1.5 sccm, and the system was operated at an arc voltage of 110V and a source beam of 20 mA. FIG. 8 shows the $F^+$ beam current at increasing concentrations of $H_2$, revealing that the current is only slightly affected when the $H_2$ was increased up to 50%. However, when the $BF_3$ beam spectrum of ionized species was analyzed, it showed a significant reduction in W+ and WFx+ beams when H2 was mixed with $BF_3$. See FIG. 9.

Example 5

Figure 10:
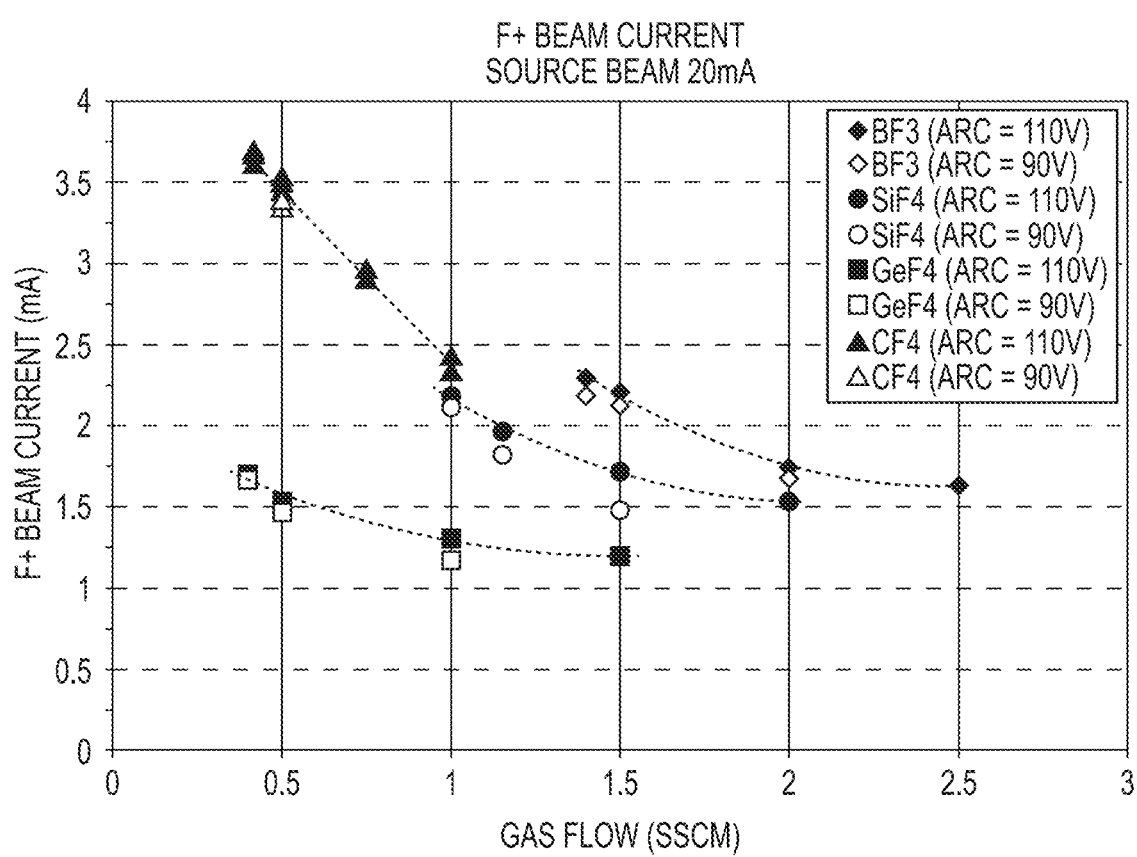
FIG. 10 compares $F^+$ beam currents generated at different flow rates of for different fluorine containing gases.

The F+ beam current generated from different fluorine gases ($BF_3$, $SiF_4$, $GeF_4$, $CF_4$) under the same operating conditions was evaluated. The gases were independently flowed into an ionization chamber having tungsten chamber having tungsten liners. The system was operated at an arc voltage of 110V and an arc voltage of 90V and source beam of 20 mA. F+ ion beam current was measured at various flow rates for each of the gases. At lower flow rates, $CF_4$ generated significantly higher $F^+$ beam currents than $BF_3$, $SiF_4$ and $GeF_4$. Results are shown in FIG. 10.

Example 6

Figure 11:
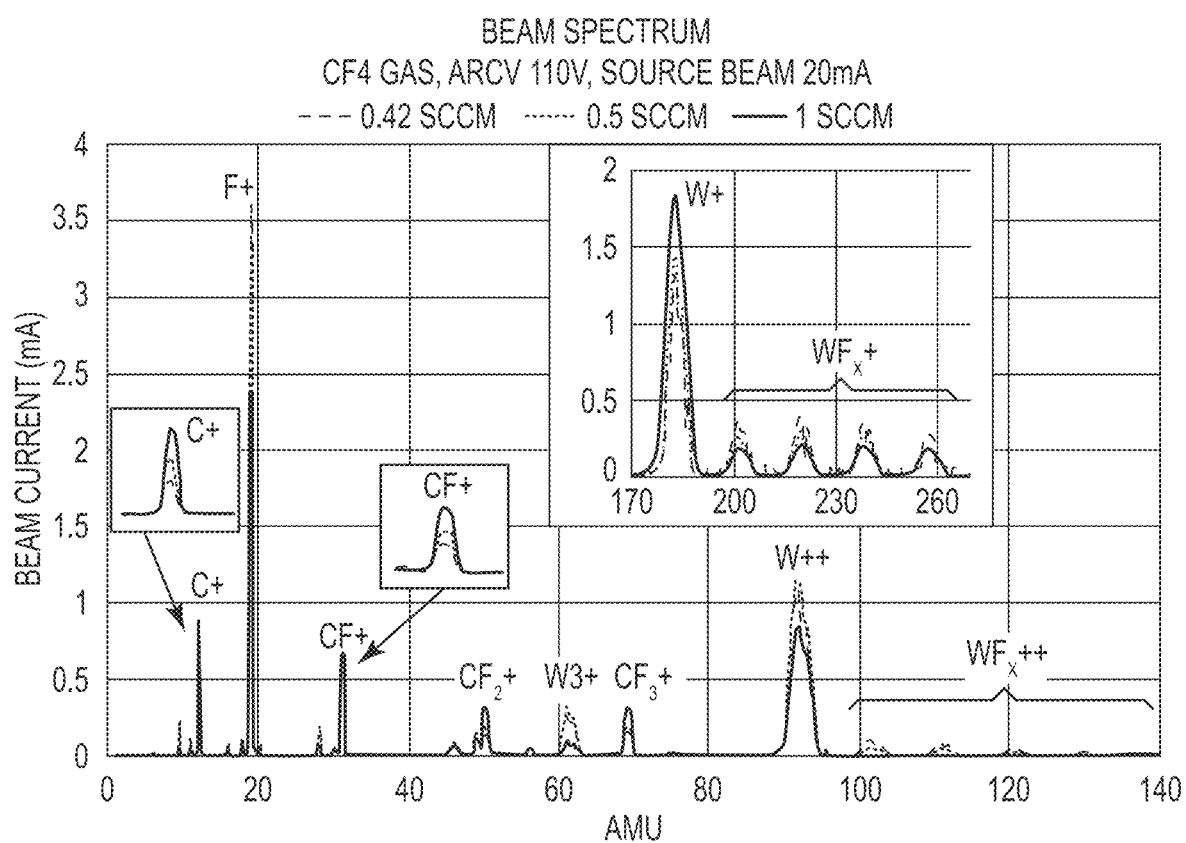
FIG. 11 shows the beam spectrum data for $CF_4$ gas at different flow rates in the presence of a tungsten arc chamber having tungsten liners.

FIG. 11 shows the $F^+$ beam spectrum generate from $CF_4$ under the conditions described in Example 5 at different gas flow rates. As can be seen, higher $F^+$ beam currents were generated at lower gas flow rats. When the gas flow rate was increased from 0.42 sccm to 1 sccm, the $F^+$ and $W^{++}$ beam currents decreased and the $W^+$, $C^+$ and $CF^+$ beam currents increased.

Example 7

Figure 12:
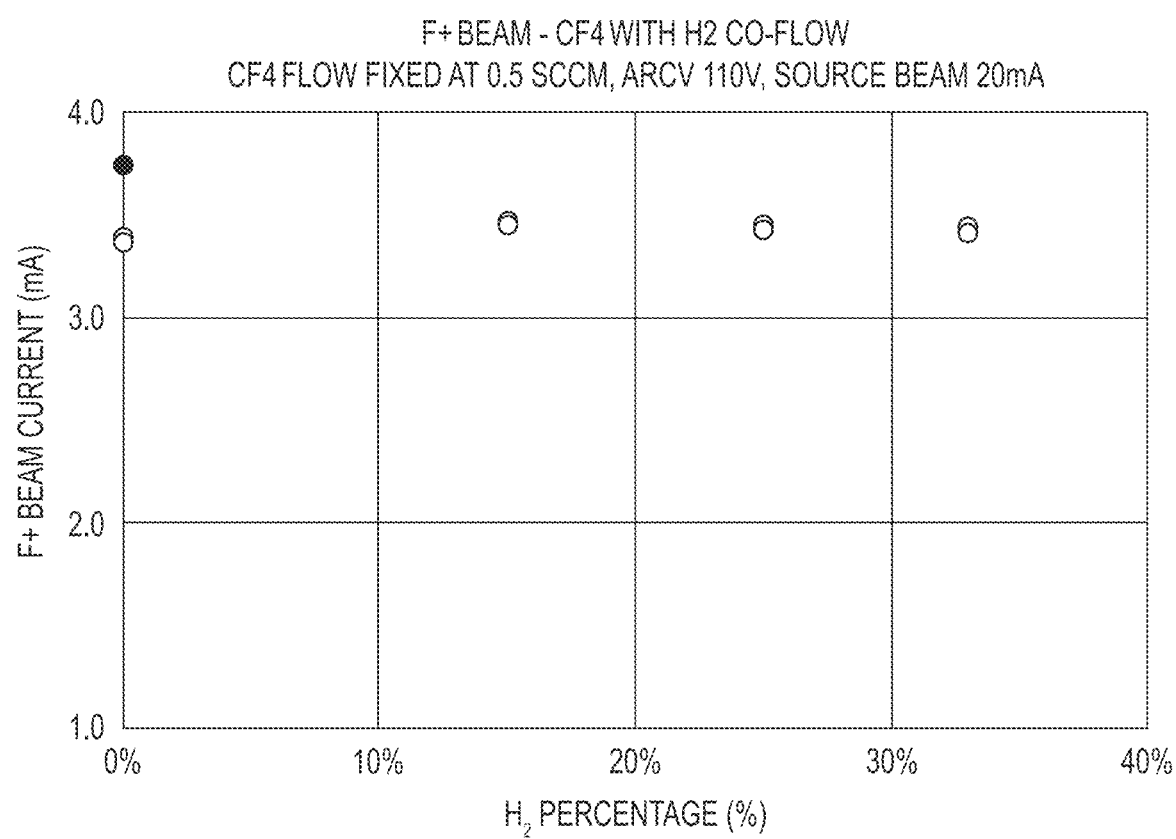
FIG. 12 shows $F^+$ beam current data plotted against the percentage of hydrogen in a gas mixture containing $CF_4$ and $H_2$.
Figure 13:
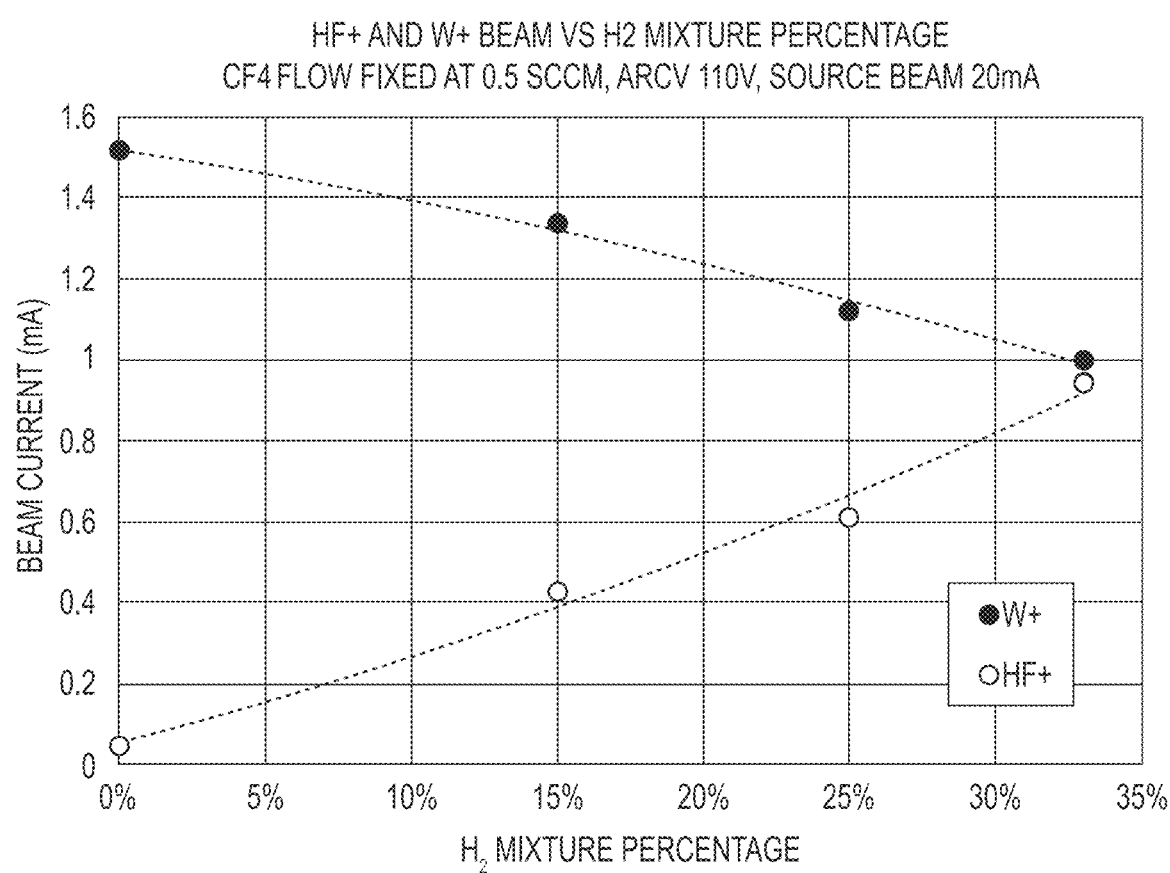
FIG. 13 shows $HF^+$ and $W^+$ beam current data plotted against the percentage of hydrogen in a gas mixture containing $CF_4$ and $H_2$.

A gas mixture containing $CF_4$ and $H_2$ as flowed to an ion implantation system including a tungsten arc chamber having a tungsten liner at a fixed flow rate of 0.5 sccm, an arc voltage of 110V and a source beam of 20 mA. FIG. 12 shows $F^+$ beam current as function of the percentage of hydrogen gas in the mixture. No significant impact on $F^+$ beam current was observed for mixtures containing up to 33% hydrogen. FIG. 13 shows the $HF^+$ and $W^+$ beam currents plotted as a function of the amount of hydrogen in the gas mixture. As expected, the $W^+$ beam current was significant reduced and the $HF^+$ beam current increased.

Example 8

Figure 14:
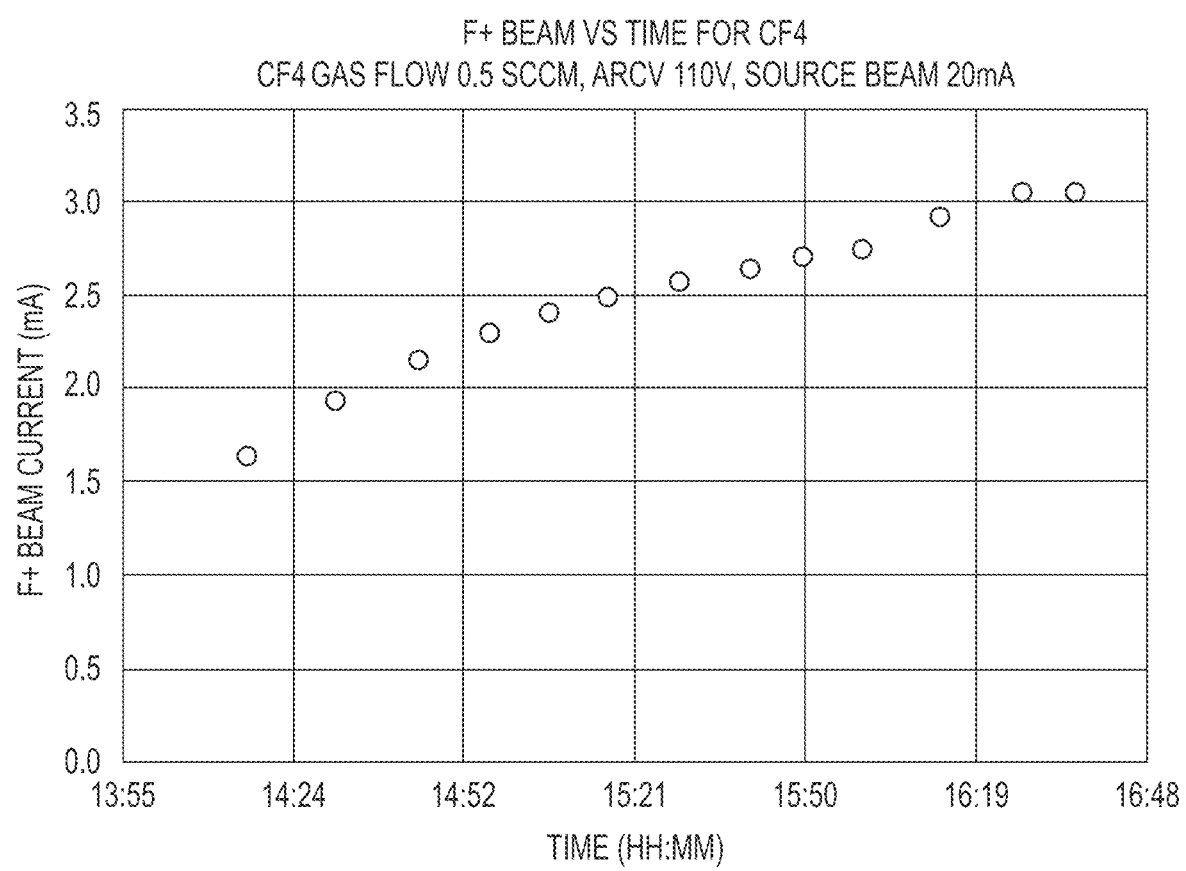
FIG. 14 shows a plot of $F^+$ beam current evolution with time for $CF_4$ gas when $CF_4$ gas undergoes ionization in an ion implantation system including a tungsten arc chamber having tungsten liners.
Figure 15:
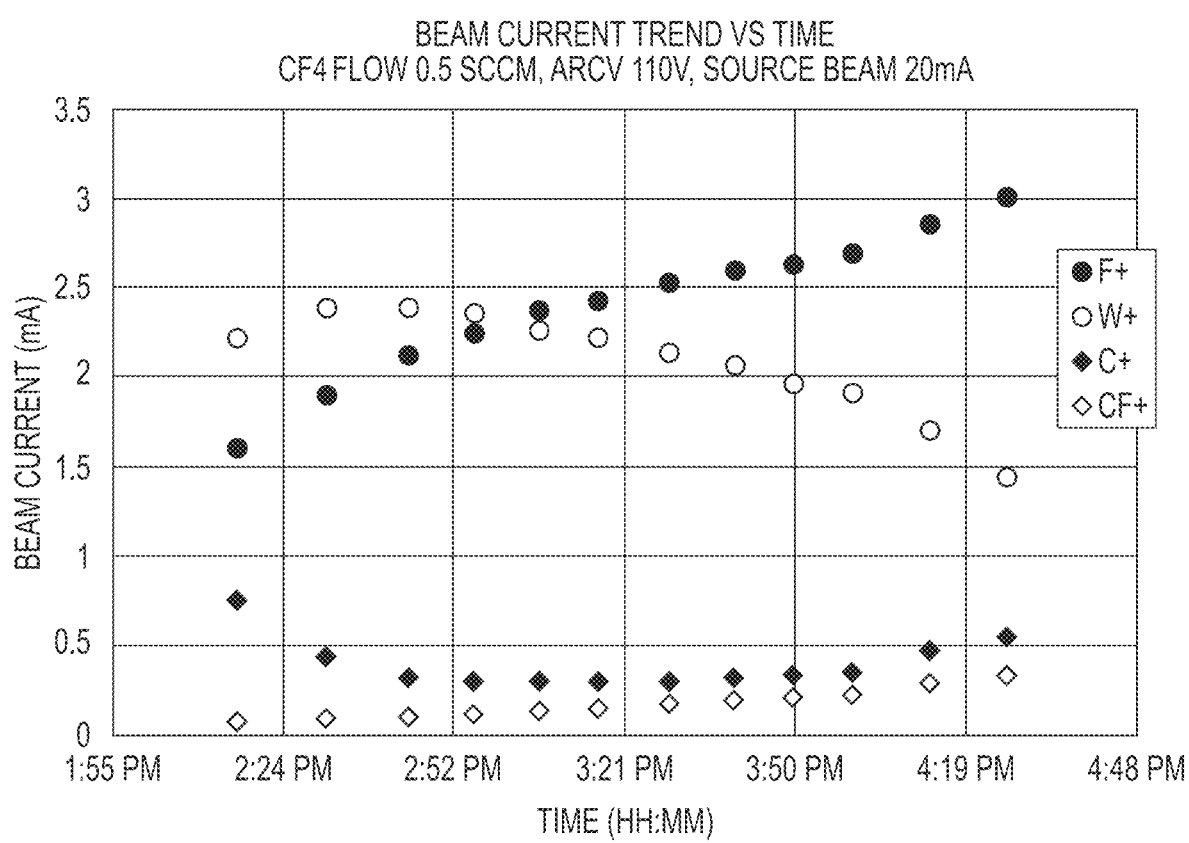
FIG. 15 shows beam current trends as a function of time for F+, W+, C+ and CF+ beam currents generated from $CF_4$ gas in the presence of a tungsten arc chamber having tungsten liners.

The stability of the $F^+$ beam current generated form the ionization of CF4 in a tungsten arc chamber having a tungsten liner at a fixed flow rate of 0.5 sccm, an arc voltage of 110V and a source beam of 20 mA was studied. FIG. 14 shows that the $F^+$ beam current increased over time and becomes stable after 2-3 hours. FIG. 15 compares the beam currents for F+, $C^+$, $CF^+$, $W^+$ generated over the evaluation time period shown in FIG. 14. The $C^+$ beam current was reduced during the first half of time period and started to increase the second half of the time period. The initial reduction in $C^+$ could be due to removing carbon residue from previous CO beam. The late increasing trend of the $C^+$ beam current might be related to carbon deposition from $CF_4$ itself. The $CF^+$ beam current had a contact increasing trend which is aligned with $F^+$ beam current.

What is claimed is:
1. A fluorine ion implantation method, comprising:
   flowing a composition comprising a fluorine compound to an ion implanter at a predetermined flow rate,
      wherein the fluorine compound comprises at least a non-fluorine atom and a plurality of fluorine atoms,
      wherein the ion implanter is configured for fluorine ion implantation into a substrate;
   operating the ion implanter to generate a fluorine ionic species from the fluorine compound at a predetermined arc power and a predetermined magnetic field,
      wherein the fluorine ionic species includes a cluster species comprising a plurality of fluorine ions,
      wherein the predetermined flow rate, the predetermined arc power, and the predetermined magnetic field are chosen to provide an optimized beam current for the fluorine ionic species,
      wherein the fluorine ionic species includes at least one of $F_2^+$, $SiF_2^+$, $SiF_3^+$, $SiF_4^+$, $Si_2F^+$, $Si_2F_2^+$, $Si_2F_3^+$, $Si_2F_4^+$, $Si_2F_5^+$, $Si_2F_6^+$, $BF_2^+$, $BF_3^+$, $B_2F^+$, $B_2F_2^+$, $B_2F_3^+$, $B_2F_4^+$, $PF_2^+$, $PF_3^+$, $PF_4^+$, $PF_5^+$, $AsF_2^+$, $AsF_3^+$, $AsF_4^+$, $AsF_5^+$, $SbF_2^+$, $SbF_3^+$, $SbF_4^+$, $SbF_5^+$, $WF_2^+$, $WF_3^+$, $WF_4^+$, $WF_5^+$, $WF_6^+$, $CF_2^+$, $CF_3^+$, $CF_4^+$, $C_2F_2^+$, $C_2F_3^+$, $C_2F_4^+$, $C_2F_5^+$, $C_2F_6^+$, $GeF_2^+$, $GeF_3^+$, $GeF_4^+$, $Ge_2F^+$, $Ge_2F_2^+$, $Ge_2F_3^+$, $Ge_2F_4^+$, $Ge_2F_5^+$, or $Ge_2F_6^+$; and
   implanting the fluorine ionic species into the substrate.
2. The fluorine ion implantation method of claim 1, wherein the fluorine ionic species comprise a species having a greatest number of fluorine atoms, and the predetermined flow rate, the predetermined arc power, and the predeter- mined magnetic field are chosen so the species having the greatest number of fluorine atoms has a beam current that is greater than beam current(s) of specie(s) having a fewer number of fluorine atoms.

3. The fluorine ion implantation method of claim 1, wherein the implanting further comprises: the desired fluorine ionic specie being implanted in the substrate at a desired depth using the predetermined flow rate, the predetermined arc power and the predetermined magnetic field.

4. The fluorine ion implantation method of claim 1, wherein the predetermined arc power is in the range of 5 W to 2500 W.

5. The fluorine ion implantation method of claim 1, wherein the predetermined flow rate is not greater than 10 sccm.

6. The fluorine ion implantation method of claim 1, wherein the predetermined flow rate is in the range of 0.2 sccm to 6 sccm.

7. The fluorine ion implantation method of claim 1, wherein (a) the fluorine compound has formula $Q_xF_y$,
wherein Q is an element capable of forming a bond with fluorine (F), and
the fluorine ionic species includes a compound of formula $Q_uF_v^+$, and F+, $F_2^+$,
wherein x is an integer that is greater than or equal to u, and
u is an integer that is greater than or equal to 1; and
wherein y is an integer that is greater than or equal to v, and v is an integer that is greater than or equal to 1;
wherein (b) the fluorine compound has formula $Q_xR_zF_y$,
wherein Q and R are elements capable of forming a bond with fluorine (F), and
the fluorine ionic species includes a compound of formula $Q_uR_wF_v^+$, and F+, $F_2^+$,
wherein x is an integer that is greater than or equal to u, and
u is an integer that is greater than or equal to 1;
wherein y is an integer that is greater than or equal to v, and v is an integer that is greater than or equal to 1, and
wherein z is an integer that is greater than or equal to w, and w is an integer that is greater than or equal to 1; or
wherein (c) the fluorine compound has formula $F_y$, and the fluorine ionic species includes a compound of formula $F_v^+$,
wherein y is an integer that is greater than or equal to v, and v is an integer that is greater than or equal to 1; or
wherein (d) a mixture of two or more fluorine compounds of formulas $Q_xF_y$, $Q_xR_zF_y$, and $F_y$ are used.

8. The fluorine ion implantation method of claim 1, wherein the fluorine compound is selected from the group consisting of $F_2$, $BF_3$, BHF, $BHF_2$, $B_2F_4$, $SiF_4$, $Si_2F_6$, $SiHF_3$, $SiH_2F_2$, $SiH_3F$, $Si_2H_3F_3$, $Si_2H_5F$, $Si_2HF_5$, $GeF_4$, $Ge_2F_4$, $Ge_2F_6$, $GeHF_3$, $GeH_2F_2$, $GeH_3F$, $PF_3$, $PF_5$, $PHF_2$, $PH_2F$, $PH_3F_2$, $P_2HF$, $AsF_3$, $AsF_5$, $AsHF_2$, $AsH_2F$, $AsH_3F_2$, $SbF_3$, $SbF_5$, $XeF_2$, $XeF_4$, $XeF_6$, $WF_6$, $MoF_6$, $C_nF_{2n+2}$, $C_nF_{2n}$, $C_nF_{2n-2}$, $C_nH_xF_{2n+2-x}$, $C_nH_xF_{2n-x}$, $C_nH_xF_{2n-2-x}$, $COF_2$, $SF_6$, $SF_4$, $SeF_6$, $NF_3$, $N_2F_4$, $NHF_2$, $NH_2F$, NHF, $N_2H_3F$ and HF, wherein n is an integer in the range of 1-3, and x is 0, 1, or 2.

9. The fluorine ion implantation method of claim 1, wherein the flowing further comprises further comprises flowing a hydrogen-containing compound which is different than the fluorine compound, to the ion implanter, wherein the hydrogen-containing compound is selected from the group consisting of $H_2$, $B_2H_6$, $SiH_4$, $Si_2H_6$, $GeH_4$, $Ge_2H_6$, $PH_3$, $AsH_3$ $CH_4$, $C_2H_6$, $C_xH_y$, $C_xH_yF_z$ (where x and y and z are equal or greater than 1), $NH_3$ and $N_2H_4$.

10. The fluorine ion implantation method of claim 9, wherein the hydrogen-containing compound is flowed to the ion implanter at a rate from 0.01 sccm to 10 sccm.

11. The fluorine ion implantation method of claim 1, wherein the flowing further comprises flowing an oxygen-containing compound which is different than the fluorine compound, to the ion implanter wherein the oxygen-containing compound is selected from the group consisting of $O_2$, $O_3$, $H_2O$, $H_2O_2$, CO, $CO_2$, NO, $NO_2$, $N_2O$, $N_4O$, $N_2O_3$, $N_2O_4$, $N_2O_5$, $N_{26}$ and $COF_2$.

12. The fluorine ion implantation method of claim 1, wherein the flowing further comprises flowing an inert gas to the ion implanter, wherein the inert gas is selected from the group consisting of nitrogen, helium, neon, argon, krypton, and xenon.

13. The fluorine ion implantation method of claim 12, wherein the inert gas is selected from the group consisting of nitrogen, helium, neon, argon, krypton, and xenon.

14. The fluorine ion implantation method of claim 1, wherein flowing further comprises co-flowing two or more of a fluorine-containing gas, a hydrogen-containing gas, an oxygen-containing gas, or an inert gas.

15. A fluorine ion implantation method, comprising:
optimizing an optimized beam current for a fluorine ionic species by choosing to provide a predetermined flow rate, a predetermined arc power, and a predetermined magnetic field,
wherein the optimized beam current is optimized for at least one of $F_2^+$, $SiF_2^+$, $SiF_3^+$, $SiF_4^+$, $Si_2F^+$, $Si_2F_2^+$, $Si_2F_3^+$, $Si_2F_4^+$, $Si_2F_5^+$, $Si_2F_6^+$, $BF_2^+$, $BF_3^+$, $B_2F^+$, $B_2F_2^+$, $B_2F_3^+$, $B_2F_4^+$, $PF_2^+$, $PF_3^+$, $PF_4^+$, $PF_5^+$, $AsF_2^+$, $AsF_3^+$, $AsF_4^+$, $AsF_5^+$, $SbF_2^+$, $SbF_3^+$, $SbF_4^+$, $SbF_5^+$, $WF_2^+$, $WF_3^+$, $WF_4^+$, $WF_5^+$, $WF_6^+$, $CF_2^+$, $CF_3^+$, $CF_4^+$, $C_2F_2^+$, $C_2F_3^+$, $C_2F_4^+$, $C_2F_5^+$, $C_2F_6^+$, $GeF_2^+$, $GeF_3^+$, $GeF_4^+$, $Ge_2F^+$, $Ge_2F_2^+$, $Ge_2F_3^+$, $Ge_2F_4^+$, $Ge_2F_5^+$, or $Ge_2F_6^+$;
flowing a composition comprising a fluorine compound to an ion implanter at the predetermined flow rate,
wherein the fluorine compound comprises at least a non-fluorine atom and a plurality of fluorine atoms,
wherein the ion implanter is configured for fluorine ion implantation into a substrate;
operating the ion implanter to generate the fluorine ionic species from the fluorine compound at the predetermined arc power and the predetermined magnetic field,
wherein the fluorine ionic species comprises a species having a greatest number of fluorine ions, and
the optimized beam current is greater than beam current(s) of specie(s) having a fewer number of fluorine ions; and
implanting the fluorine ionic species into the substrate.

16. A fluorine ion implantation method, comprising:
flowing a composition comprising a fluorine compound to an ion implanter at a predetermined flow rate,
wherein the fluorine compound comprises at least a non-fluorine atom and a plurality of fluorine atoms,
wherein the ion implanter is configured for fluorine ion implantation into a substrate,
wherein the predetermined flow rate is not greater than 10 sccm;

operating the ion implanter to generate a fluorine ionic species from the fluorine compound at a predetermined arc power and a predetermined magnetic field,
wherein the predetermined arc power ranges from 5 W to 2500 W,
wherein the predetermined flow rate, the predetermined arc power, and the predetermined magnetic field are chosen to provide an optimized beam current for the fluorine ionic species,
wherein the fluorine ionic species includes at least one of $F_2^+$, $SiF_2^+$, $SiF_3^+$, $SiF_4^+$, $Si_2F^+$, $Si_2F_2^+$, $Si_2F_3^+$, $Si_2F_4^+$, $Si_2F_5^+$, $Si_2F_6^+$, $BF_2^+$, $BF_3^+$, $B_2F^+$, $B_2F_2^+$, $B_2F_3^+$, $B_2F_4^+$, $PF_2^+$, $PF_3^+$, $PF_4^+$, $PF_5^+$, $AsF_2^+$, $AsF_3^+$, $AsF_4^+$, $AsF_5^+$, $SbF_2^+$, $SbF_3^+$, $SbF_4^+$, $SbF_5^+$, $WF_2^+$, $WF_3^+$, $WF_4^+$, $WF_5^+$, $WF_6^+$, $CF_2^+$, $CF_3^+$, $CF_4^+$, $C_2F_2^+$, $C_2F_3^+$, $C_2F_4^+$, $C_2F_5^+$, $C_2F_6^+$, $GeF_2^+$, $GeF_3^+$, $GeF_4^+$, $Ge_2F^+$, $Ge_2F_2^+$, $Ge_2F_3^+$, $Ge_2F_4^+$, $Ge_2F_5^+$, or $Ge_2F_6^+$; and
implanting the fluorine ionic species into the substrate.

* * * * *